(12) United States Patent
Cheng et al.

(10) Patent No.: US 9,478,468 B1
(45) Date of Patent: Oct. 25, 2016

(54) DUAL METAL CONTACT SCHEME FOR CMOS DEVICES

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/795,524

(22) Filed: Jul. 9, 2015

(51) Int. Cl.
H01L 29/66 (2006.01)
H01L 29/78 (2006.01)
H01L 21/8238 (2006.01)
H01L 27/092 (2006.01)

(52) U.S. Cl.
CPC ............. H01L 21/823871 (2013.01); H01L 21/823828 (2013.01); H01L 21/823857 (2013.01); H01L 27/092 (2013.01)

(58) Field of Classification Search
CPC .......... H01L 2924/0002; H01L 2924/00; H01L 29/66545; H01L 21/823807; H01L 21/28518; H01L 21/823814; H01L 21/823871; H01L 21/84; H01L 27/1203; H01L 29/665; H01L 27/092
USPC ............... 257/369, E27.112, E27.062, 288; 438/199, 233
See application file for complete search history.

(56) References Cited

U.S. PATENT DOCUMENTS

| | | | |
|---|---|---|---|
| 8,187,962 B2 | 5/2012 | Hampp | |
| 8,288,828 B2 | 10/2012 | Iwatake et al. | |
| 8,546,910 B2 | 10/2013 | Yin et al. | |
| 2011/0104893 A1 | 5/2011 | Zhang et al. | |
| 2012/0187460 A1* | 7/2012 | Lavoie | H01L 29/665 257/288 |
| 2012/0217589 A1 | 8/2012 | Yin et al. | |
| 2014/0001561 A1* | 1/2014 | Cheng | H01L 21/82380 257/369 |
| 2014/0353734 A1* | 12/2014 | Xie | H01L 21/283 257/288 |

FOREIGN PATENT DOCUMENTS

| | | |
|---|---|---|
| CN | 102044422 | 5/2011 |
| CN | 103489787 | 1/2014 |
| CN | 103489825 | 1/2014 |
| JP | 2009272527 | 11/2009 |
| TW | 201117301 | 5/2011 |

* cited by examiner

*Primary Examiner* — David Vu
*Assistant Examiner* — Jonathan Han
(74) *Attorney, Agent, or Firm* — Scully, Scott, Murphy & Presser, P.C.; Daniel P. Morris, Esq.

(57) ABSTRACT

A semiconductor structure includes non-metal semiconductor alloy containing contact structures for an n-type field effect transistor (nFET) and a metal semiconductor alloy containing contact structures for a p-type field effect transistor (pFET). Notably, each non-metal semiconductor alloy containing contact structure includes a titanium liner that directly contacts a topmost surface of a source/drain region of the nFET, while each metal semiconductor alloy containing contact structure includes a Ni—Pt semiconductor alloy contact that directly contacts a surface of a source/drain region of the pFET.

20 Claims, 11 Drawing Sheets

DUAL METAL CONTACT SCHEME FOR CMOS DEVICES

BACKGROUND

The present application relates to semiconductor technology, and more particularly to a semiconductor structure including a non-metal semiconductor alloy containing contact structure for an n-type field effect transistor (nFET) and a metal semiconductor alloy containing contact structure for a p-type field effect transistor (pFET) and a method of forming the same.

Field effect transistors (FETs) are the basic building block of today's integrated circuits. Such transistors can be formed in conventional bulk substrates (such as silicon) or in semiconductor-on-insulator (SOI) substrates.

State of the art FETs can be fabricated by depositing a gate conductor over a gate dielectric and a semiconductor substrate. Generally, the FET fabrication process implements lithography and etching processes to define the gate structures. After providing the gate structures, source/drain extensions are formed into a portion of the semiconductor substrate and on both sides of each gate structure by ion implantation. Sometimes this implant is performed using a spacer to create a specific distance between the gate structure and the implanted junction. In some instances, such as in the manufacture of an nFET device, the source/drain extensions for the nFET device are implanted with no spacer. For a pFET device, the source/drain extensions are typically implanted with a spacer present. A thicker spacer is typically formed after the source/drain extensions have been implanted. In some instances, deep source/drain implants can be performed with the thick spacer present. In other instances, and for advanced technologies, the source region and the drain region can be formed using a selective epitaxial growth process.

In prior art processes, source/drain metal semiconductor alloy contacts are formed on the source region and the drain region of both the nFET and the pFET devices. The formation of source/drain metal semiconductor alloy contacts on the surface of the source region and the drain region typically requires that a transition metal be deposited on the semiconductor substrate followed by a process to produce the metal semiconductor alloy. Such a process forms source/drain metal semiconductor alloy contacts to the deep source/drain regions of both the nFET and the pFET devices.

Metal semiconductor alloy contact resistance contributes to an ever larger portion of the total parasitic resistance in advanced complementary metal oxide semiconductor (CMOS) devices for current 20 nm and 14 nm technology nodes. Thus, there is a need for providing source/drain metal contacts in which the contact resistance is reduced. Moreover, there is a need for providing a source/drain metal contact that is beneficial for nFET devices, and another source/drain metal contact that is beneficial for pFET devices which can be readily co-integrated in one processing scheme.

SUMMARY

A semiconductor structure is provided that includes non-metal semiconductor alloy containing contact structures for an n-type field effect transistor (nFET) and metal semiconductor alloy containing contact structures for a p-type field effect transistor (pFET). Notably, each non-metal semiconductor alloy containing contact structure includes a titanium liner that directly contacts a topmost surface of a source/drain region of the nFET, while each metal semiconductor alloy containing contact structure includes a Ni—Pt semiconductor alloy contact that directly contacts a surface of a source/drain region of the pFET.

In one aspect of the present application, a semiconductor structure is provided that includes a Ti liner contact for an nFET and a Ni—Pt semiconductor alloy contact for a pFET. In one embodiment of the present application, the semiconductor structure includes a substrate including a first semiconductor material portion located in an nFET device region and a second semiconductor material portion located in a pFET device region. An nFET functional gate structure is located on a surface of the first semiconductor material portion, wherein a source region is located on one side of the nFET functional gate structure and a drain region is located on another side of the nFET functional gate structure. A pFET functional gate structure is located on a surface of the second semiconductor material portion, wherein a source region is located on one side of the pFET functional gate structure and a drain region is located on another side of the pFET functional gate structure. nFET contact structures are present that contact an exposed portion of the source region and the drain region of the nFET functional gate structure. Each of the nFET contact structures includes a Ti liner in direct physical contact with an exposed portion of a surface of one of the source region or the drain region of the nFET functional gate structure. pFET contact structures are also present that contact an exposed portion of the source region and the drain region of the pFET functional gate structure. Each of the pFET contact structures includes a Ni—Pt semiconductor alloy in direct physical contact with an exposed portion of a surface of one of the source region or the drain region of the pFET functional gate structure.

In another aspect of the present application, a method of forming a semiconductor structure including a Ti liner contact for an nFET and a Ni—Pt semiconductor alloy contact for a pFET is provided. In one embodiment, the method includes forming a structure comprising an nFET functional gate structure located on a surface of a first semiconductor material portion of a substrate, wherein a source region is formed on one side of the nFET functional gate structure and a drain region is formed on another side of the nFET functional gate structure, and a pFET functional gate structure located on a surface of a second semiconductor material portion of the substrate, wherein a source region is formed on one side of the pFET functional gate structure and a drain region is formed on another side of the pFET functional gate structure. Next, a middle-of-the-line (MOL) dielectric material is formed surrounding the nFET functional gate structure and the pFET functional gate structure, wherein the MOL dielectric material comprises contact openings that expose a portion of each of the source regions and the drain regions of both the nFET functional gate structure and the pFET functional gate structure. nFET contact structures are formed within a first set of the contact openings and contacting the exposed portion of the source region and the drain region of the nFET functional gate structure, and pFET contact structures are formed within a second set of the contact openings and contacting the exposed portion of the source region and the drain region of the pFET functional gate structure. Each of the nFET contact structures includes a Ti liner in direct physical contact with the exposed portion of one of the source region or the drain region of the nFET functional gate structure. Each of the pFET contact structures includes a Ni—Pt semiconductor alloy in direct physical contact with the exposed portion of one of the source region or the drain region of the pFET functional gate structure.

DETAILED DESCRIPTION

Figure 1:
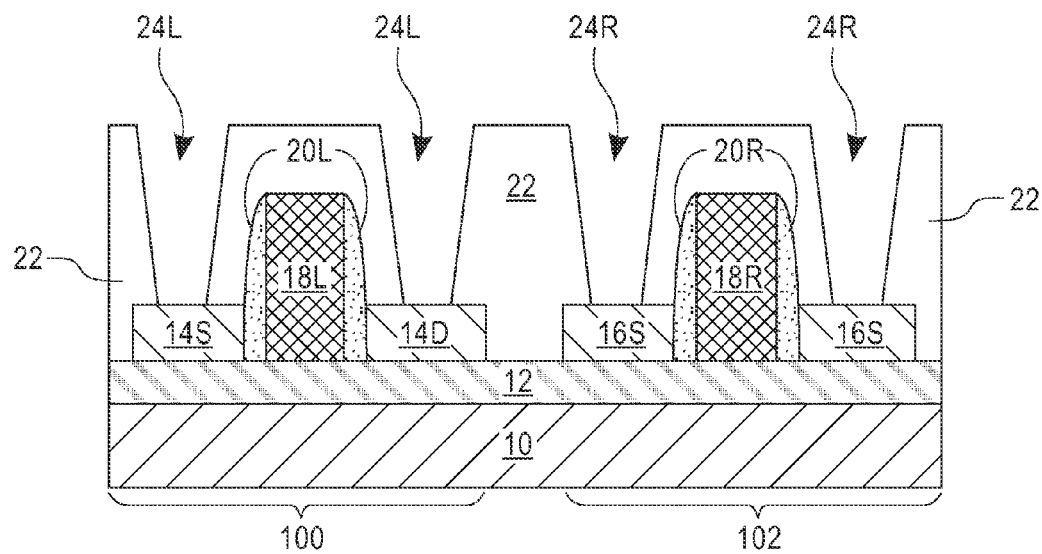
FIG. 1 is a cross sectional view of an exemplary semiconductor structure including an nFET device region containing an nFET functional gate structure and a pFET device region including a pFET functional gate structure, wherein a middle-of-the-line (MOL) dielectric material surrounds each functional gate structure and the MOL dielectric material has contact openings that expose a source region and a drain region of each of the functional gate structures that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Titanium (Ti) liner is being suggested as a new contact material for source/drain metal contact formation since it has lower contact resistance for nFET devices and does not need to be converted into a metal semiconductor alloy. No metal semiconductor alloy formation means no material consumption which is highly desirable for merged and unmerged FinFET source/drain epitaxy contacts. Although a Ti liner is beneficial for nFET contact formation (i.e., lower resistance than a conventional metal semiconductor alloy such as, for example, Ni—Pt silicide), the Ti liner is not suitable for pFET contact because of Schottky height (Ti is an nFET contact metal and it has a very high contact resistance for pFETs).

Ni—Pt semiconductor alloys are beneficial for pFET devices, but such metal semiconductor alloys are not suitable for nFET devices due to higher contact resistance. Moreover, there is also a concern with metal semiconductor alloy piping in highly defective nFET source/drain epitaxial merged materials such as, for example, silicon doped with phosphorous (Si:P).

Since Ti is better for nFET contacts and Ni—Pt semiconductor alloys are better for pFET contacts, a method and structure are provided for co-integrating both contacts in a single processing scheme without the obvious process of forming one, then forming the other one, thus reducing masking levels and processing steps. Specifically, a semiconductor structure is provided that includes non-metal semiconductor alloy containing contact structures for an n-type field effect transistor (nFET) and metal semiconductor alloy containing contact structures for a p-type field effect transistor (pFET). Notably, each non-metal semiconductor alloy containing contact structure includes a titanium liner that directly contacts a topmost surface of a source/drain region of the nFET, while each metal semiconductor alloy containing contact structure includes a Ni—Pt semiconductor alloy contact that directly contacts a surface of a source/drain region of the pFET.

Although the following description and drawings illustrate the basic processing steps employed to form contact structures for FinFET devices, the basic concept of the present application can be applied to form contact structures for other non-planar devices such as, for example, gate all-around devices, as well as contact structures for planar semiconductor devices.

Referring first to FIG. 1, there is illustrated an exemplary semiconductor structure including an nFET device region 100 containing an nFET functional gate structure 18L and a pFET device region 102 including a pFET functional gate structure 18R, wherein a middle-of-the-line (MOL) dielectric material 22 surrounds each functional gate structure (18L, 18R) and the MOL dielectric material 22 has contact openings (24L, 24R) that expose a source region (14S, 16S) and a drain region (14D, 16D) of each of the functional gate structures (18L, 18R) that can be employed in accordance with an embodiment of the present application. In the illustrated embodiment of FIG. 1, the exemplary semiconductor structure further includes dielectric spacers (20L, 20R), an insulator layer 12 and a handle substrate 10. In some embodiments, the handle substrate 10 can be omitted. In other embodiments, elements 12 and 10 collectively represents a remaining portion of a bulk semiconductor substrate.

Although not shown in the cross sectional view of FIG. 1, the source region 14S is in contact with the drain region 14D by a body region, while the source region 16S is in contact with the drain region 16D by a body region. The body region that is located laterally between the source region (14S, 16S) and the drain region (14D, 16D) is located behind the respective functional gate structure (18L, 18R) and dielectric spacers (20L, 20R) shown in FIG. 1. Collectively, each source region, each body region and each drain region constitute a semiconductor fin that is formed from an upper portion of either a bulk semiconductor substrate or a semiconductor-on-insulator substrate.

In embodiments, in which a bulk semiconductor substrate is used in the present application in forming the semiconductor fin structures mentioned above, the bulk semiconductor substrate is entirely composed of at least one semiconductor material. The term "semiconductor material" as used throughout the present application denotes any semiconductor material including, for example, Si, Ge, SiGe, SiC, SiGeC, and III/V compound semiconductors such as, for example, InAs, GaAs, or InP. In some embodiments, multilayers of these semiconductor materials can also be used as the bulk semiconductor. In one embodiment, at least an upper portion of the bulk semiconductor substrate is comprised of a silicon-containing semiconductor material including, but not limited to, pure, i.e., unalloyed, silicon, or a silicon alloy such as, for example, SiGe, SiC, and/or SiGeC. In one embodiment, the upper portion of the bulk semiconductor substrate can be comprised of a single crystalline semiconductor material, such as, for example, single crystalline silicon.

In another embodiment, a semiconductor-on-insulator (SOI) substrate can be employed in the present application. In this embodiment, a topmost semiconductor material layer of the SOI substrate can be processed into the semiconductor fin structures mentioned above. An SOI substrate includes handle substrate 10, insulator layer 12 located on an upper surface of the handle substrate 10, and a topmost semiconductor material layer, such as a Si-containing semiconductor layer, located on an uppermost surface of the insulator layer 12. The handle substrate 10 provides mechanical support for the insulator layer 12 and the topmost semiconductor material layer. The handle substrate 10 and the topmost semiconductor material layer of the SOI substrate may comprise the same, or different, semiconductor material. In one embodiment, at least the topmost semiconductor material layer of the SOI substrate is a Si-containing layer such as, for example, unalloyed silicon or a silicon alloy such as, for example, SiGe, SiC, SiGeC. In some embodiments, the handle substrate 10 is a non-semiconductor material including, for example, a dielectric material and/or a conductive material. In yet other embodiments, the handle substrate 10 can be omitted and a substrate including an insulator layer 12 and the topmost semiconductor material layer can be used in the present application to provide the exemplary semiconductor structure shown in FIG. 1.

The insulator layer 12 of the SOI substrate may be a crystalline or non-crystalline oxide or nitride. In one embodiment, the insulator layer 12 is an oxide such as, for example, silicon dioxide. In another embodiment, the insulator layer 12 is a nitride such as, for example silicon nitride or boron nitride. In yet other embodiments, insulator layer 12 is a multilayered stack of, in any order, silicon dioxide and boron nitride.

The SOI substrate may be formed utilizing standard processes including for example, SIMOX (separation by ion implantation of oxygen) or layer transfer in which two wafers are bonded together.

When an SOI substrate is employed, the thickness of the topmost semiconductor material layer of the SOI substrate can be from 10 nm to 100 nm. Other thicknesses that are lesser than, or greater than, the aforementioned thickness range may also be employed as the thickness of the topmost semiconductor material layer of the SOI substrate. The insulator layer 12 of the SOI substrate can have a thickness from 5 nm to 200 nm. Other thicknesses that are lesser than, or greater than, the aforementioned thickness range may also be employed as the thickness of the insulator layer 12 of the SOI substrate. The thickness of the handle substrate 10 of the SOI substrate is inconsequential to the present application.

Semiconductor fins, which are spaced apart from each other, can be formed in both the nFET device region 100 and the pFET device region 102 by patterning either a topmost portion of a bulk semiconductor substrate or a topmost semiconductor material layer of an SOI substrate. Following the patterning process, and if needed, a semiconductor fin cut may be used. In one embodiment, the patterning process used to define each semiconductor fin may include lithography and etching. The semiconductor fin that is present in the nFET device region 100 may be referred to as a first semiconductor material portion, while the semiconductor fin in the pFET device region 102 may be referred to as a second semiconductor material portion. Each semiconductor fin that is formed includes a pair of vertical sidewalls that are parallel to each other. As used herein, a surface is "vertical" if there exists a vertical plane from which the surface does not deviate by more than three times the root mean square roughness of the surface. Each semiconductor fin that is formed includes a pair of sidewalls that are parallel to each other. Each semiconductor fin has a width from 5 nm to 30 nm and a length from 100 nm to 2000 nm. Other widths and lengths are possible and can be used in the present application for each semiconductor fin.

Lithography includes forming a photoresist material (not shown) on either an upper portion of a bulk semiconductor substrate or a topmost semiconductor material layer of an SOI substrate. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of either an upper portion of a bulk semiconductor substrate or a topmost semiconductor material layer of an SOI substrate. The pattern provided by the patterned photoresist material is thereafter transferred into the underlying material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment of the present application, a sidewall image transfer (SIT) process can be used as the patterning process that defines each semiconductor fin. The SIT process includes forming a contiguous mandrel material layer (not shown) over a topmost portion of a bulk semiconductor substrate or a topmost semiconductor material layer of an SOI substrate. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into an upper portion of a bulk semiconductor substrate or a topmost semiconductor material layer of an SOI substrate. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In any of the patterning processes mentioned above, a hard mask layer such as, for example, silicon dioxide and/or silicon nitride may be formed on a topmost portion of a bulk semiconductor substrate or a topmost semiconductor material layer of an SOI substrate prior to patterning. After patterning, a remaining portion of the hard mask layer is present atop each semiconductor fin that is formed. The portion of the hard mask layer that remains after patterning can be referred to herein as hard mask cap (not shown). The hard mask cap can be removed after patterning by a planarization process such as, for example, chemical mechanical planarization and/or grinding.

After forming the semiconductor fins, a gate structure (functional and/or sacrificial) can be formed straddling over a portion of each of the semiconductor fins within the nFET device region 100 and the pFET device region 102. In the illustrated embodiment, element 18L is a nFET functional gate structure, and element 18R is a pFET functional gate structure. By "straddle over or straddling over" it is meant that at least one portion of a gate structure is located on one side of the semiconductor fin, while another portion of the same gate structure is located on another side of the semiconductor fin. The two portions are interconnected by a portion of the gate structure that is located directly atop the semiconductor fin. As shown, each gate structure has a surface that contacts a topmost surface of insulator layer 12.

By "functional gate structure" it is meant a permanent gate structure used to control output current (i.e., flow of carriers in the channel) of a semiconducting device through electrical or magnetic fields. Each functional gate structure (18L, 18R) includes a gate material stack of, from bottom to top, a gate dielectric portion and a gate conductor portion; the individual components of the functional gate structure are not shown in the drawings of the present application. In some embodiments, a gate cap portion can be present atop the gate conductor portion. Although a single functional gate structure (18L, 18R) is described and illustrated, a plurality of functional gate structures (18L, 18R) straddling over different portions of each semiconductor fin within the various device regions (i.e., nFET device region 100 and pFET device region 102) can be formed.

The gate dielectric portion of the functional gate structure (18L, 18R) comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric portion. In some embodiments, each gate dielectric portion of nFET functional gate structure 18L and pFET functional gate structure 18R comprises a same gate dielectric material. In other embodiments, the gate dielectric portion for nFET functional gate structure 18L comprises a different gate dielectric material than the gate dielectric portion for pFET functional gate structure 18R.

The gate dielectric material used in providing each gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing each gate dielectric portion can have a thickness in a range from 1 nm to 10 nm. Other thicknesses that are lesser than, or greater than, the aforementioned thickness range can also be employed for the gate dielectric material.

The gate conductor portion of the each functional gate structure (18L, 18R) comprises a gate conductor material. The gate conductor material used in providing each gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion of nFET functional gate structure 18L is a same conductive material as the gate conductor portion of pFET functional gate structure 18R. In other embodiments, the gate conductor portion of nFET functional gate structure 18L comprises a different gate conductor material than the gate conductor portion of pFET functional gate structure 18R. For example, the gate conductor portion of nFET functional gate structure 18L may comprise an nFET gate metal, while the gate conductor portion of pFET functional gate structure 18R may comprise a pFET gate metal.

The gate conductor material used in providing each gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portion of nFET functional gate structure 18L compared to the gate conductor portion of pFET functional gate structure 18R, block mask technology can be used. In one embodiment, the gate conductor material used in providing each gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion of the functional gate structure (18L, 18R) comprises a gate cap material. The gate cap material that provides the gate cap portion may include one of the dielectric materials mentioned above for the hard mask material that can be used to define the semiconductor fins. In one embodiment, each gate cap portion comprises silicon dioxide, silicon nitride, and/or silicon oxynitride. The dielectric material that provides the gate cap portion can be formed utilizing a conventional deposition process such as, for example, chemical vapor deposition or plasma enhanced chemical vapor deposition. The dielectric material that provides the gate cap portion can has a thickness from 5 nm to 20 nm. Other thicknesses that are lesser than, or greater than, the aforementioned thickness range can also be employed as the thickness of the dielectric material that provides the gate cap portion.

The functional gate structures (18L, 18R) can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structures, sacrificial gate structures are formed instead of a functional gate structure. In yet other embodiments, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers (20L, 20R) can be formed on exposed sidewall surfaces of the respective gate structure. The dielectric spacers (20L, 20R) may comprise one of the dielectric materials mentioned above for dielectric spacers used in the SIT process. The dielectric spacers can be formed by depositing a spacer material and thereafter a spacer etch can be performed.

Next, source region 14S is formed on one side of the gate structure (i.e., nFET functional gate structure 18L) and within an exposed first portion of the semiconductor fin (i.e., the first semiconductor material portion) within the nFET device region 100, and drain region 14D is formed on another side of the gate structure (i.e., nFET functional gate structure 18L) and within an exposed second portion of the semiconductor fin (i.e., the first semiconductor material portion) within the nFET device region 100. In one embodiment, the source region 14S and the drain region 14D can be formed by introducing an n-type dopant or a p-type dopant into portions of the semiconductor fin not covered by the gate structure (i.e., nFET functional gate structure 18L), and the dielectric spacer 20L. The term "p-type" refers to the addition of impurities to an intrinsic semiconductor that creates deficiencies of valence electrons. "N-type" refers to the addition of impurities that contributes free electrons to an intrinsic semiconductor. The doping may be achieved utilizing ion implantation or gas phase doping. In embodiments in which a sacrificial gate structure was employed, the sacrificial gate structure can now be replaced with a functional gate structure providing nFET functional gate structure 18L in the nFET device region 100. The source region 16S and the drain region 16D within the pFET device region 102 can be formed within exposed portion of the semiconductor fin (i.e., the second semiconductor material portion) in a similar manner as the source region 14S and the drain region 14D. In some embodiments, an epitaxial semiconductor material that is doped can be grown on the exposed portions of each semiconductor fin (i.e., the first and second semiconductor material portions) and can be used as the source/drain regions (14S, 14D, 16S, 16D) of the respective functional gate structures (18L, 18R). The epitaxial semiconductor material between the source regions and drain regions within a given device region can be merged or unmerged.

After forming the source/drain regions (14S, 14D, 16S, 16D) of the respective functional gate structures (18L, 18R), MOL dielectric material 22 is formed surrounding each of the source/drain regions (14S, 14D, 16S, 16D) of the respective functional gate structures (18L, 18R). The MOL dielectric material 22 has a height that is greater than a height of each functional gate structure 18L, 18R. The MOL dielectric material 22 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In one embodiment, the MOL dielectric material 22 can be formed utilizing a deposition process including, for example, chemical vapor deposition (CVD), plasma enhanced chemical vapor deposition (PECVD), evaporation or spin-on coating.

After providing the MOL dielectric material 22, contact openings (24L, 24R) are formed to expose the source/drain regions (14S, 14D, 16S, 16D) of the respective functional gate structures (18L, 18R). Element 24L is a contact opening within the nFET device region 100. Contact openings 24L expose a portion of source region 14S or the drain region 14D. Element 24R is a contact opening within the pFET device region 102. Contact openings 24R expose a portion of source region 16S or the drain region 16D. Each contact opening (24L, 24R) can be formed in the MOL dielectric material 22 by lithography and etching.

Figure 2:
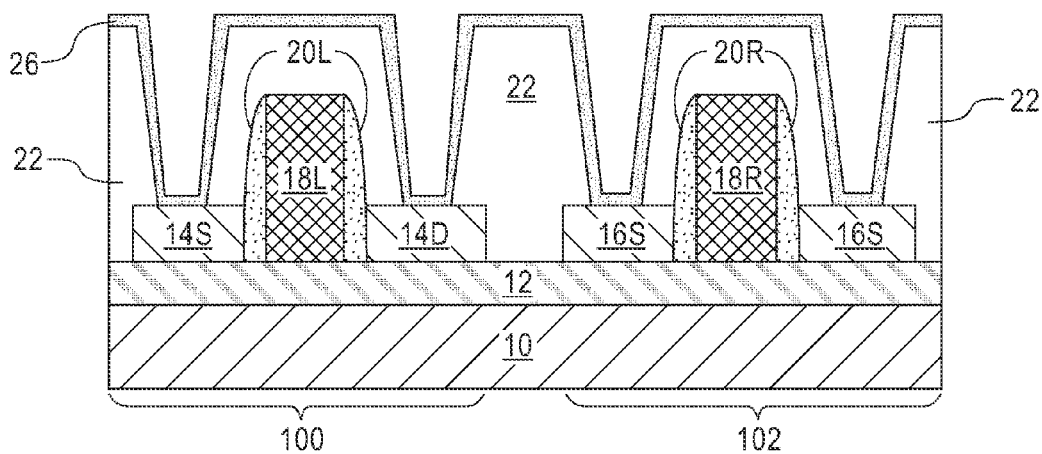
FIG. 2 is a cross sectional view of the exemplary semiconductor structure of FIG. 1 after forming a titanium layer atop the MOL dielectric material and within each contact opening within the nFET device region and the pFET device region.

Referring now to FIG. 2, there is illustrated the exemplary semiconductor structure of FIG. 1 after forming a titanium layer 26 atop the MOL dielectric material 22 and within each contact opening (24L, 24R) within the nFET device region 100 and the pFET device region 102. The titanium layer 26 is a contiguous layer that covers the entirety of the exposed surfaces shown in FIG. 1. Notably, the titanium layer 26 is formed on the exposed topmost surface of the MOL dielectric material 22, on exposed sidewall surfaces of the MOL dielectric material 22 within each contact opening (24L, 24R) and on exposed portions of each source region (14S, 16S) and each drain region (14D, 16D).

The titanium layer 26 can be formed by a deposition process such as, for example, chemical vapor deposition (CVD), plasma enhanced chemical vapor deposition (CVD), atomic layer deposition (ALD), physical vapor deposition (PVD), sputtering, chemical solution deposition, or plating. The titanium layer 26 that is deposited may have a thickness from 2 nm to 50 nm. Other thicknesses that are greater than, or lesser than, the aforementioned thickness range can also be used for the thickness of the titanium layer 26 as long as a contiguous titanium layer 26 is formed and as long as the titanium layer 26 does not entirely fill each contact opening (24L, 24R).

Figure 3:
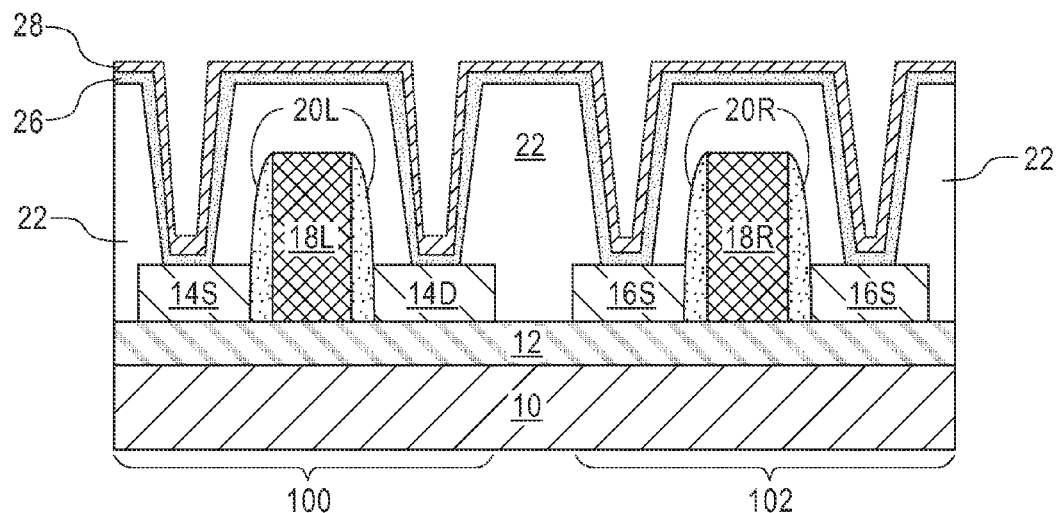
FIG. 3 is a cross sectional view of the exemplary semiconductor structure of FIG. 2 after forming a diffusion barrier layer on the titanium layer.

Referring now to FIG. 3, there is illustrated the exemplary semiconductor structure of FIG. 2 after forming a diffusion barrier layer 28 on the titanium layer 26. The diffusion barrier layer 28 is a contiguous layer that covers an entirety of the underlying titanium layer 26.

The diffusion barrier layer 28 may comprise a first diffusion barrier material or combination of first diffusion barrier materials that prevent a conductive material (such as a conductive metal to be subsequently formed) from diffusing therethrough. Examples of materials that can be used as the diffusion barrier layer 28 include, but are not limited to, tantalum (Ta), tantalum nitride (TaN), titanium nitride (TiN), ruthenium (Ru), ruthenium nitride (RuN), ruthenium tantalum nitride (RuTaN), W (tungsten), tungsten nitride (WN) and any combination thereof. In one example, the diffusion barrier layer 28 comprises TiN. The diffusion barrier layer 28 can be formed by a deposition process such as, for example, chemical vapor deposition (CVD), plasma enhanced chemical vapor deposition (CVD), atomic layer deposition (ALD), physical vapor deposition (PVD), sputtering, chemical solution deposition, or plating. The diffusion barrier layer 28 that is deposited may have a thickness from 2 nm to 50 nm. Other thicknesses that are greater than, or lesser than, the aforementioned thickness range can also be used for the thickness of the diffusion barrier layer 28 as long as a contiguous diffusion barrier material is formed and as long as the diffusion barrier layer 28 does not entirely fill each contact opening (24L, 24R).

Figure 4:
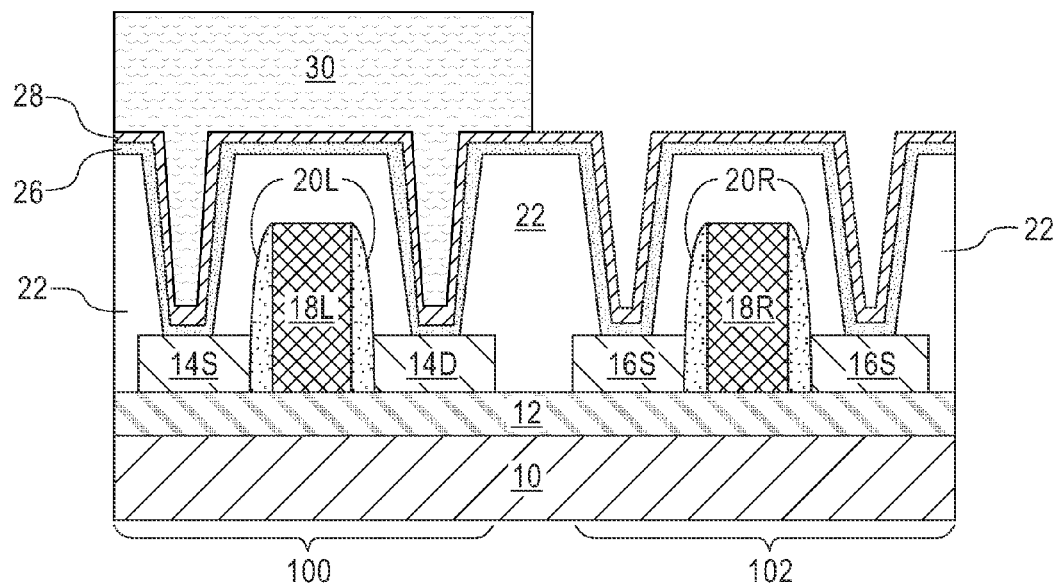
FIG. 4 is a cross sectional view of the exemplary semiconductor structure of FIG. 3 after forming a block mask over the nFET device region, while leaving the pFET device region exposed.

Referring now to FIG. 4, there is illustrated the exemplary semiconductor structure of FIG. 3 after forming a block mask 30 over the nFET device region 100, while leaving the pFET device region 102 exposed. Notably, block mask 30 protects a portion of the diffusion barrier layer 28 and a portion of the titanium layer 26 that is within the nFET device region 100, while leaving other portions of the diffusion barrier layer 28 and other portions of the titanium layer 26, which are generally within the pFET device region 102, exposed. As is shown, a portion of block mask 30 can be present in each contact opening 24L in the nFET device region 100.

Block mask 30 that can be used in the present application may include any material that can protect the nFET device region 100, while leaving the pFET device region 102 exposed for further processing. In one embodiment, the block mask 30 may be composed of only a photoresist material. In another embodiment, the block mask 30 may be composed of only a hard mask material. Examples of hard mask materials that can be used as a block mask 30 include silicon dioxide, silicon nitride and/or silicon oxynitride. In another embodiment of the present application, the block mask 30 may comprise a stack of, from bottom to top, a hard mask material and a photoresist material. The block mask 30 can be formed utilizing techniques that are well known to those skilled in the art. For example, the block mask 30 can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask 30.

Figure 5:
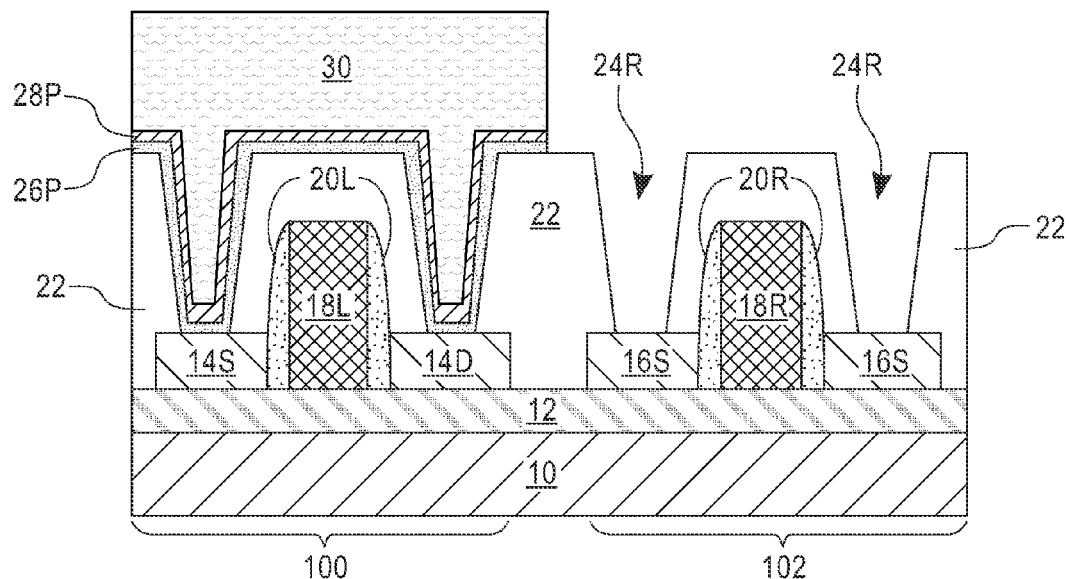
FIG. 5 is a cross sectional view of the exemplary semiconductor structure of FIG. 4 after removing the diffusion barrier layer and the titanium layer from the pFET device region, but not the nFET device region.

Referring now to FIG. 5, there is illustrated the exemplary semiconductor structure of FIG. 4 after removing the diffusion barrier layer 28 and the titanium layer 26 from the pFET device region 102, but not the nFET device region 100. As is shown, the entirety of each contact opening 24R (including the sidewall surfaces of the MOL dielectric material 22 and a portion of the source region 16S and the drain region 16D) in the pFET device region 102 is bare after performing this step of the present application.

The remaining portion of the diffusion barrier layer 28 within the nFET device region 100 constitutes a diffusion barrier layer portion 28P, while the remaining portion of the titanium layer 26 within the nFET device region 100 constitutes a Ti layer portion 26P. The diffusion barrier layer 28 and the titanium layer 26 that are not protected by the block mask 30 and which are generally located in the pFET device region 102 can be removed utilizing one or more etching processes that are selective in removing the diffusion barrier material that provides the diffusion barrier layer 28 and titanium relative to the block mask 30, the MOL dielectric material 22, and the semiconductor material that provides source region 16S and drain region 16D. In one embodiment, different wet etch processes can be used. In one example, HCl can be used to remove the exposed portions of the diffusion barrier layer 28, while aqua regia can be used in removing the exposed portions of titanium from the pFET device region 102.

Figure 6:
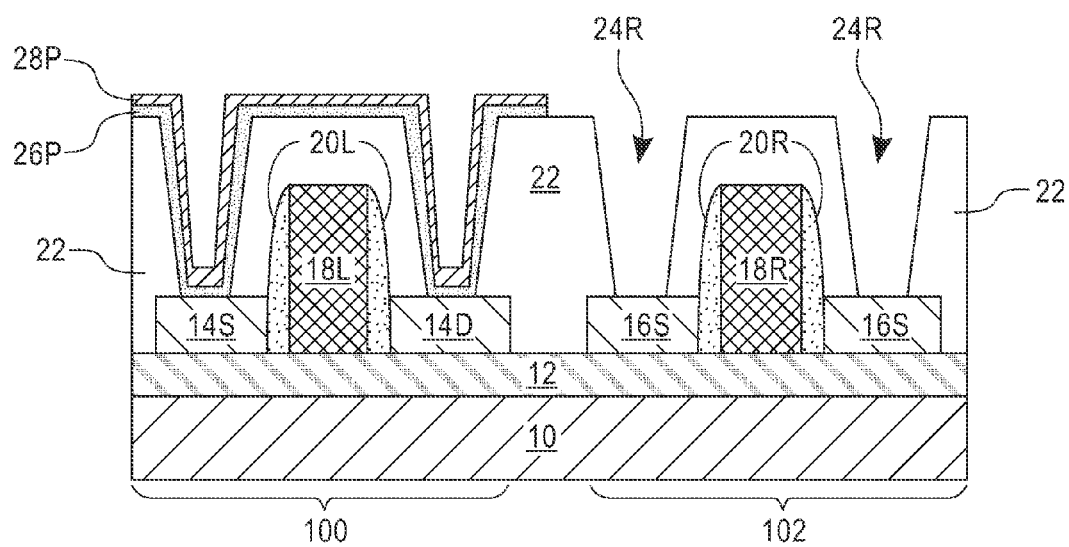
FIG. 6 is a cross sectional view of the exemplary semiconductor structure of FIG. 5 after removing the block mask from the nFET device region.

Referring now to FIG. 6, there is illustrated the exemplary semiconductor structure of FIG. 5 after removing the block mask 30 from the nFET device region 100. Block mask 30 can be removed utilizing any conventional material removal process including for example, ashing, and/or etching.

Figure 7:
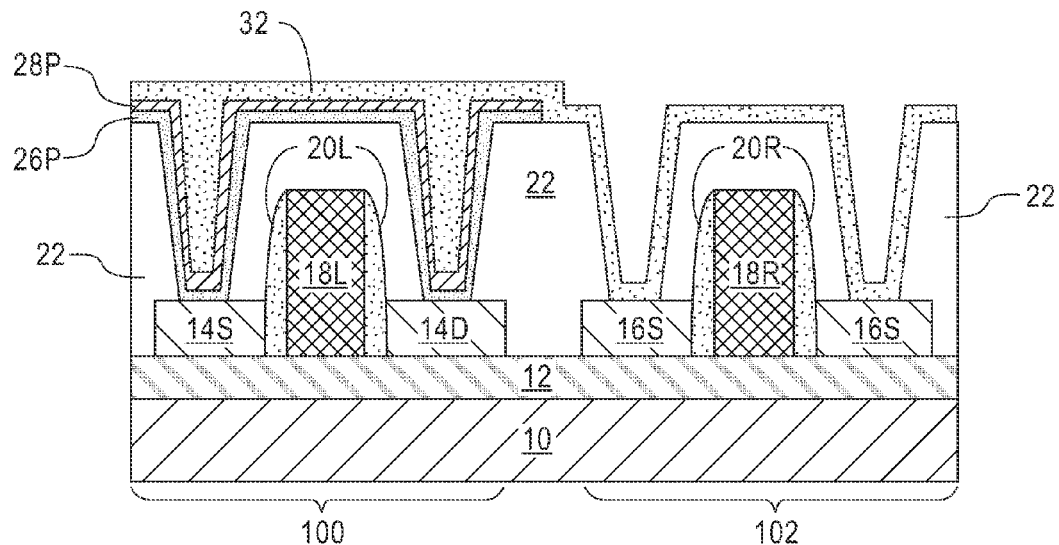
FIG. 7 is a cross sectional view of the exemplary semiconductor structure of FIG. 6 after forming a sacrificial material layer that completely fills a remaining volume of each contact opening within the nFET device region, while lining each contact opening within the pFET device region.

Referring now to FIG. 7, there is illustrated the exemplary semiconductor structure of FIG. 6 after forming a sacrificial material layer 32 that completely fills a remaining volume of each contact opening 24L within the nFET device region 100, while lining each contact opening 24R within the pFET device region 102. The sacrificial material layer 32 does not completely fill the volume of the contact openings 24R within the pFET device region 102.

The sacrificial material layer 32 can include any material that can be used to plug up the contact openings 24L within the nFET device region 100. In one embodiment, the sacrificial material layer 32 may include amorphous carbon. The sacrificial material layer 32 can be formed utilizing any deposition process such as, for example, chemical vapor deposition or plasma enhanced chemical vapor deposition.

Figure 8:
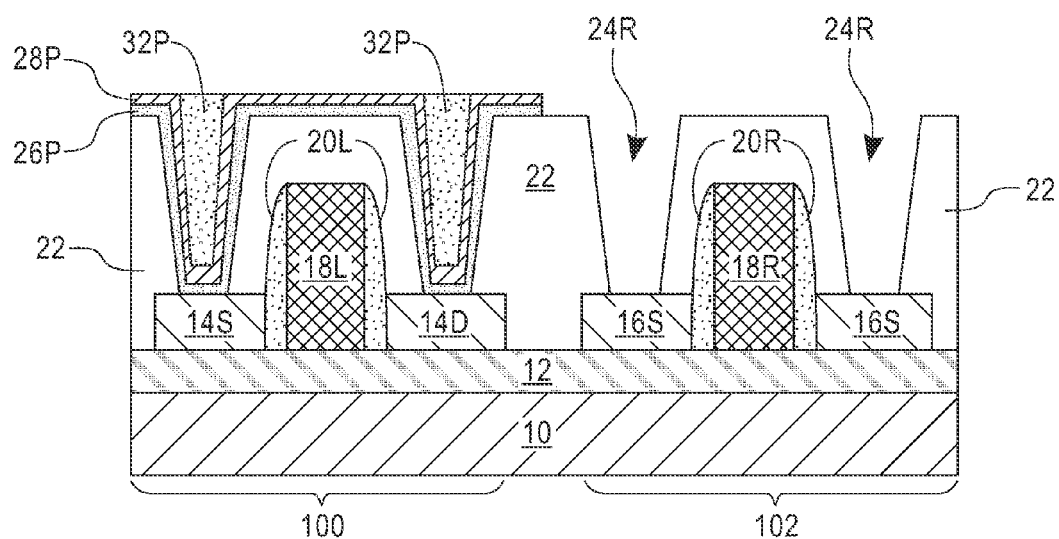
FIG. 8 is a cross sectional view of the exemplary semiconductor structure of FIG. 7 after performing an etch back process to remove a portion of the sacrificial material layer in the nFET device region and to provide a sacrificial material plug in each contact opening in the nFET device region, while completely removing the sacrificial material layer from the pFET device region.

Referring now to FIG. 8, there is illustrated the exemplary semiconductor structure of FIG. 7 after performing an etch back process to remove a portion of the sacrificial material layer 32 in the nFET device region 100 and to provide a sacrificial material plug 32P in each contact opening 24L in the nFET device region 100, while completely removing the sacrificial material layer 32 from the pFET device region 102. In one embodiment, a timed etch back process can be used to provide the exemplary semiconductor structure shown in FIG. 8. As is shown, the entirety of each contact opening 24R (including the sidewall surfaces of the MOL dielectric material 22 and a portion of the source region 16S and the drain region 16D) in the pFET device region 102 is again bare after performing this step of the present application. As is further shown, a topmost surface of the sacrificial material plug 32P is coplanar with a topmost surface of the diffusion barrier layer portion 28P.

Figure 9:
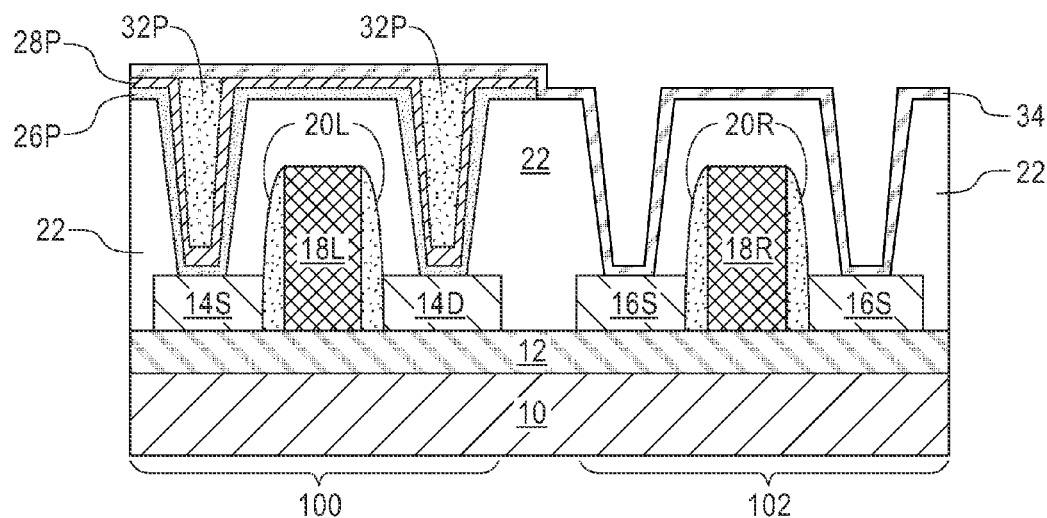
FIG. 9 is a cross sectional view of the exemplary semiconductor structure of FIG. 8 after forming a Ni—Pt alloy layer in both the nFET device region and the pFET device region, wherein a portion of the Ni—Pt alloy layer lines each contact opening in the pFET device region.

Referring now to FIG. 9, there is illustrated the exemplary semiconductor structure of FIG. 8 after forming a Ni—Pt alloy layer 34 in both the nFET device region 100 and the pFET device region 102, wherein a portion of the Ni—Pt alloy layer 34 lines each contact opening 24R in the pFET device region 102. The Ni—Pt alloy layer 34 that is formed in the present application is a contiguous layer that is present on the exposed topmost surface of the diffusion barrier layer portion 28P, on the exposed topmost surface of the sacrificial material plug 32P, on exposed topmost surface and sidewall surfaces of the MOL dielectric material 22 and on an exposed topmost surface of the source and drain regions (16S, 16D).

The Ni—Pt alloy layer 34 can be formed by a deposition process including, for example, chemical vapor deposition, plasma enhanced chemical vapor deposition, plating or sputtering. In some embodiments, the Ni—Pt alloy layer 34 can be formed utilizing a co-deposition process such as, for example, co-sputtering. In one embodiment of the present application, the Ni—Pt alloy layer 34 that is formed has an as deposited thickness of from 1 nm to 10 nm. Other thicknesses that are lesser than, or greater than, the aforementioned thickness range of the Ni—Pt alloy layer 34 may also be employed in the present application. In one embodiment of the present application, the Ni—Pt alloy layer 34 may comprise 50 atomic percent up to, but not including, 100 atomic percent Ni and the remainder being Pt.

Figure 10:
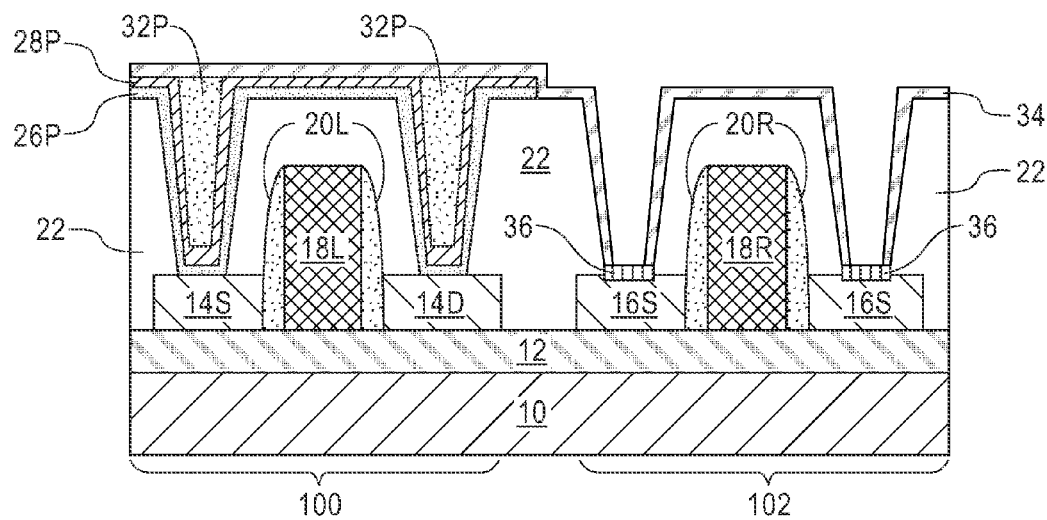
FIG. 10 is a cross sectional view of the exemplary semiconductor structure of FIG. 9 after performing an anneal to form a Ni—Pt semiconductor alloy in each contact opening in the pFET device region.

Referring now to FIG. 10, there is illustrated the exemplary semiconductor structure of FIG. 9 after performing an anneal to form a Ni—Pt semiconductor alloy 36 in each contact opening 24R in the pFET device region 102. As is shown and on one side of the pFET functional gate structure 18R, a bottommost surface of the Ni—Pt semiconductor alloy 36 directly contacts a surface of the source region 16S, while on the other side of the pFET functional gate structure 18R, a bottommost surface of the Ni—Pt semiconductor alloy 36 directly contacts a surface of the drain region 16D. During the anneal, a portion of the Ni—Pt alloy layer 34 directly above the source region 16S and the drain region 16D and a portion of the source region 16S and the drain region 16D are consumed. Thus, during annealing, a portion of the Ni—Pt alloy layer 34 and a semiconductor portion of the source region 16S or drain region 16D react and collectively form the Ni—Pt semiconductor alloy 36. Due to the presence of the diffusion barrier layer portion 28P, no metal semiconductor alloy forms in the nFET device region 100 during this step of the present application.

The anneal that is used in forming each Ni—Pt semiconductor alloy 36 can be performed at a temperature from 300° C. to 900° C. in an inert ambient such as for example, helium, argon and mixtures thereof. Other anneal temperatures can be selected as long as the anneal temperature selected is capable of forming the Ni—Pt semiconductor alloy 36. The anneal may include a rapid thermal anneal, a furnace anneal, a laser anneal or a microwave anneal. Rapid thermal anneals are typically preformed for a shorter duration of time than furnace anneals. When a rapid thermal anneal is used, the duration of the anneal at the peak temperature is typically from 1 sec to 30 sec. When a furnace anneal is used, the duration of the anneal is typically from 30 minutes to 4 hours. When a laser anneal is used, the duration of the anneal is typically from 0.1 millisecond to 1 millisecond.

Figure 11:
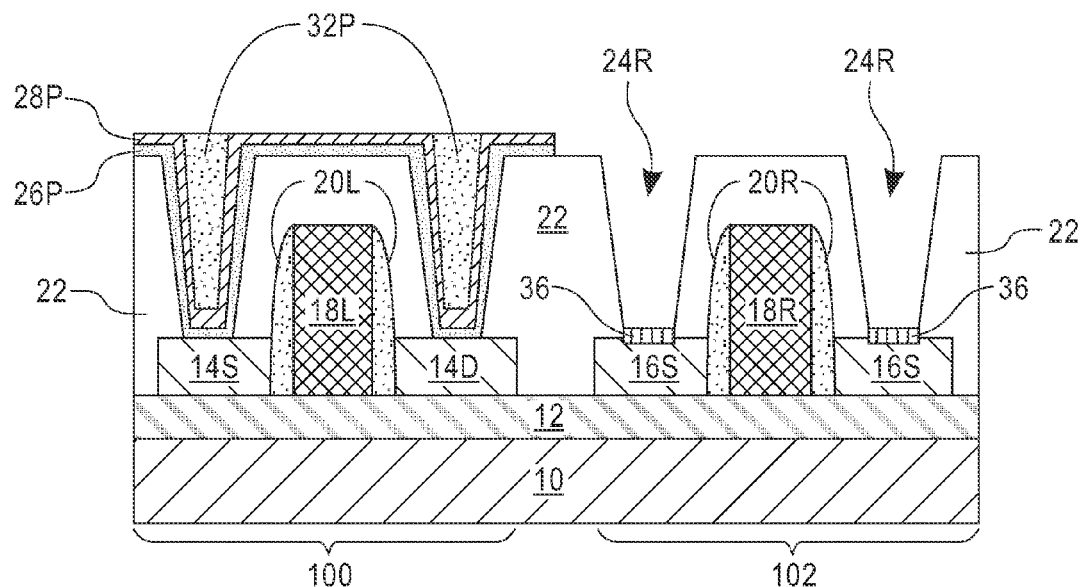
FIG. 11 is a cross sectional view of the exemplary semiconductor structure of FIG. 10 after removing the remaining Ni—Pt alloy layer in both the nFET device region and the pFET device region.

Referring now to FIG. 11, there is illustrated the exemplary semiconductor structure of FIG. 10 after removing the remaining Ni—Pt alloy layer 34 in both the nFET device region 100 and the pFET device region 102. In accordance with the present application, the unreactive portion of the NiPt alloy layer 34 can be removed after the anneal utilizing a selective etch process. In one example, a mixture of nitric acid, chloridric acid and water (so called aqua regia chemistry) etch may be used in removing any unreactive portion of the Ni—Pt alloy layer 34. As is shown, the sidewall surfaces and the topmost surface of the MOL dielectric material 22 within the pFET device region 102 are exposed after performing this step of the present application.

Figure 12:
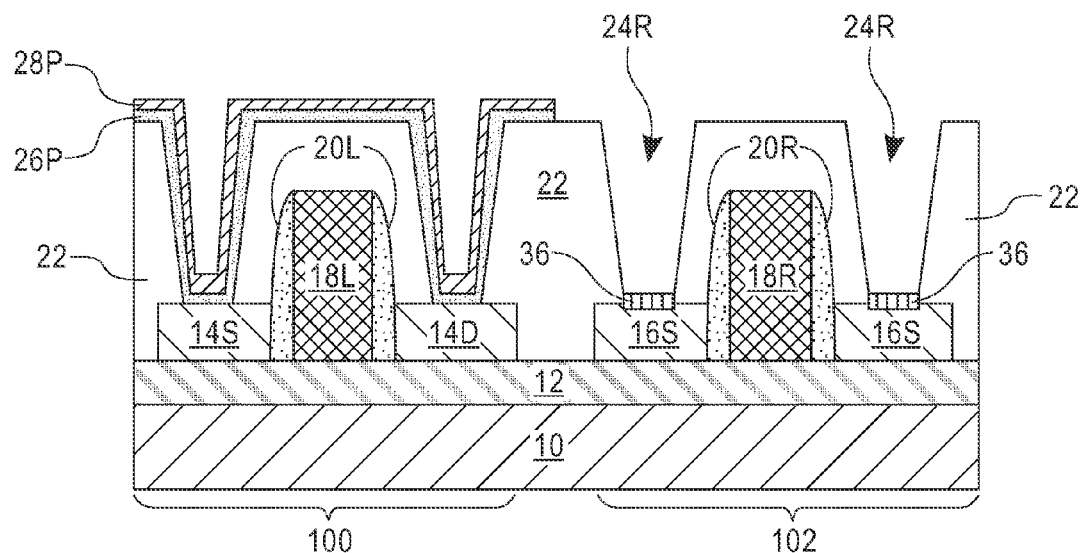
FIG. 12 is a cross sectional view of the exemplary semiconductor structure of FIG. 11 after removing the sacrificial material plug from each of the contact openings in the nFET device region.

Referring now to FIG. 12, there is illustrated the exemplary semiconductor structure of FIG. 11 after removing the sacrificial material plug 32P from each of the contact openings 24L in the nFET device region 100. The sacrificial material plug 32P can be removed utilizing an etching process that is selective in removing the material that provides the sacrificial material plug 32P. In one embodiment and when the sacrificial material plug 32P comprises amorphous carbon, an ashing process can be used to completely remove the sacrificial material plug 32P from the nFET device region 100.

Figure 13:
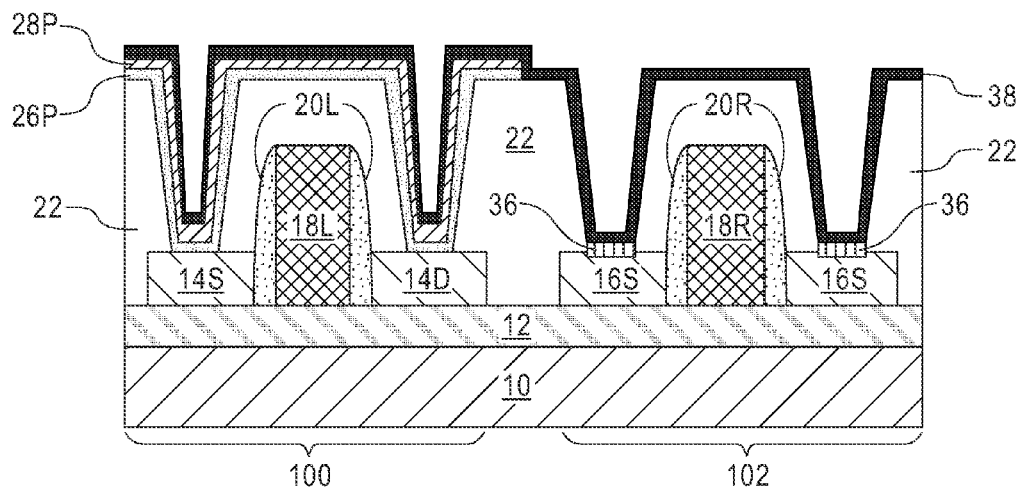
FIG. 13 is a cross sectional view of the exemplary semiconductor structure of FIG. 12 after forming another diffusion barrier layer in both the nFET and pFET device regions.

Referring now to FIG. 13, there is illustrated the exemplary semiconductor structure of FIG. 12 after forming another diffusion barrier layer 38 in both the nFET and pFET device regions (100, 102). The another diffusion barrier layer 38 is a contiguous layer that covers the entirety of the exposed surfaces of the exemplary semiconductor structure shown in FIG. 12. As is shown, the another diffusion barrier layer 38 is formed on exposed surfaces of the diffusion barrier layer portion 28P, the exposed topmost and sidewall surfaces of the MOL dielectric material 22 and on an exposed surface of the Ni—Pt semiconductor alloy 36.

The another diffusion barrier layer 38 comprise a second diffusion barrier material (or combinations of second diffusion barrier materials) which may include one of the diffusion barrier materials mentioned above for diffusion barrier layer 28. In one embodiment, the another diffusion barrier layer 38 and the diffusion barrier layer 28 comprise a same diffusion barrier material (e.g., TaN). In another embodiment, the another diffusion barrier layer 38 comprises a different diffusion barrier material than diffusion barrier layer 28. The another diffusion barrier layer 38 can be formed utilizing one of the deposition processes mentioned above in forming the diffusion barrier layer 28. Also, the another diffusion barrier layer 38 may have a thickness within the range mentioned above for diffusion barrier layer 28.

Figure 14:
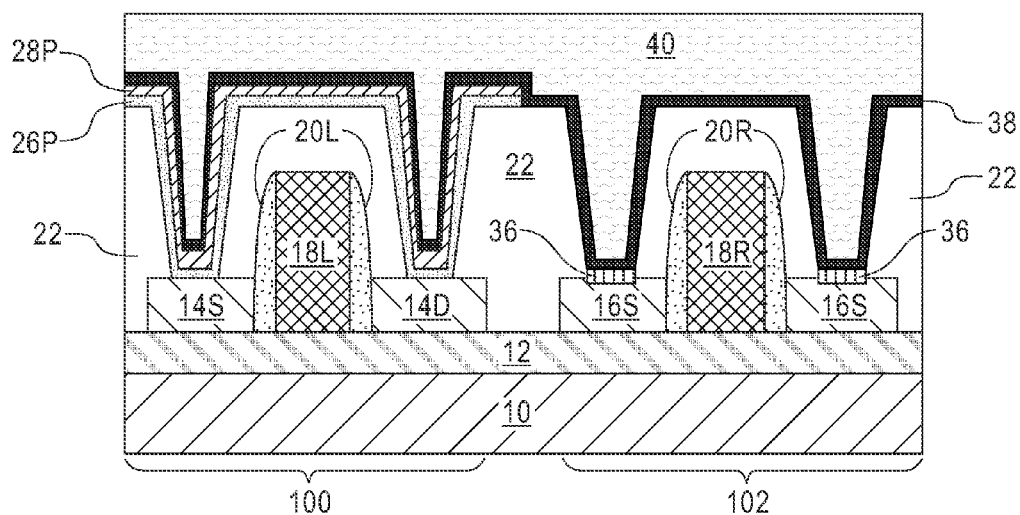
FIG. 14 is a cross sectional view of the exemplary semiconductor structure of FIG. 13 after formation of a conductive metal in both the nFET and pFET device regions.

Referring now to FIG. 14, there is illustrated the exemplary semiconductor structure of FIG. 13 after formation of a conductive metal 40 in both the nFET and pFET device regions (100, 102). The conductive metal 40 includes a conductive material other than nickel, Ni, or platinum, Pt, and other than the material or materials used as the diffusion barrier. Exemplary conductive materials that can be employed in providing the conductive metal 40 include at least one of copper (C), tungsten (W), aluminum (Al) and alloys thereof such as, for example, a copper-aluminum alloy. In one embodiment, the conductive metal 40 comprises copper or a copper alloy such as, for example, a copper-aluminum alloy. The conductive material used in providing the conductive metal 40 may be formed by a deposition process including chemical vapor deposition (CVD), plasma enhanced chemical vapor deposition (PECVD), sputtering, or chemical solution deposition. Alternatively, a plating process that fills each contact opening (24L, 24R) from the bottom upwards can be used.

Figure 15:
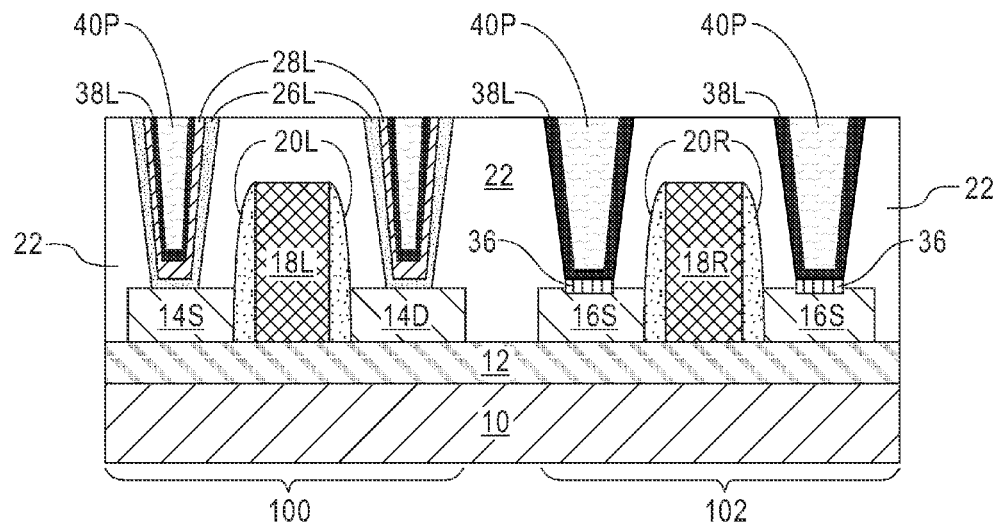
FIG. 15 is a cross sectional view of the exemplary semiconductor structure of FIG. 14 after performing a planarization process stopping at a topmost surface of the MOL dielectric material.

Referring now to FIG. 15, there is illustrated the exemplary semiconductor structure of FIG. 14 after performing a planarization process stopping at a topmost surface of the MOL dielectric material 22. The planarization process that can be used in the present application may include chemical mechanical polishing (CMP) and/or grinding. The planarization process removes portions of conductive metal 40, portions of the another diffusion barrier layer 38, portions of the diffusion barrier layer portion 28P, and portions of the titanium layer portion 26P that extend outside and above the mouth of each contact opening (24L, 24R).

Each remaining portion of the conductive metal 40 constitutes a metal contact portion 40P of the present application. Each remaining portion of the another diffusion barrier layer 38 constitutes another diffusion barrier liner 38L. Each remaining portion of the diffusion barrier layer portion 28P constitutes a diffusion barrier liner 28L; the diffusion barrier liner 28L may be referred to as a first diffusion barrier liner of the present application, while the another diffusion barrier liner 38L may be referred to herein as a second diffusion barrier liner of the present application. Each remaining portion of the titanium layer portion 26P constitutes a titanium liner 26L of the present application.

As is shown in FIG. 15, a contact structure (i.e., nFET contact structure) is provided in the nFET device region 100 that includes, from bottom to top, titanium liner 26L, diffusion barrier liner 28L, another diffusion barrier liner 38L and metal contact portion 40P. In this embodiment, topmost surfaces of each of elements 26L, 28L, 38L and 40P which provide the nFET contact structure are coplanar with each other as well as being coplanar with a topmost surface of the MOL dielectric material 22. In the nFET device region 100, a portion of the bottommost surface of the titanium liner 26L directly contacts a topmost surface of the source region 14S or the drain region 14D. In the pFET device region 102, the contact structure (i.e., pFET contact structure) includes Ni—Pt semiconductor alloy 36, another diffusion barrier liner 38L, and metal contact portion 40P. In this embodiment, topmost surfaces of elements 38L and 40P that provide the pFET contact structure are coplanar with each other as well as being coplanar with a topmost surface of the MOL dielectric material 22. Also, and in this embodiment, element 36 is buried beneath elements 38L and 40P. In the pFET device region 102, the Ni—Pt semiconductor alloy 36 directly contacts a surface of the source region 16S or the drain region 16D.

Figure 16:
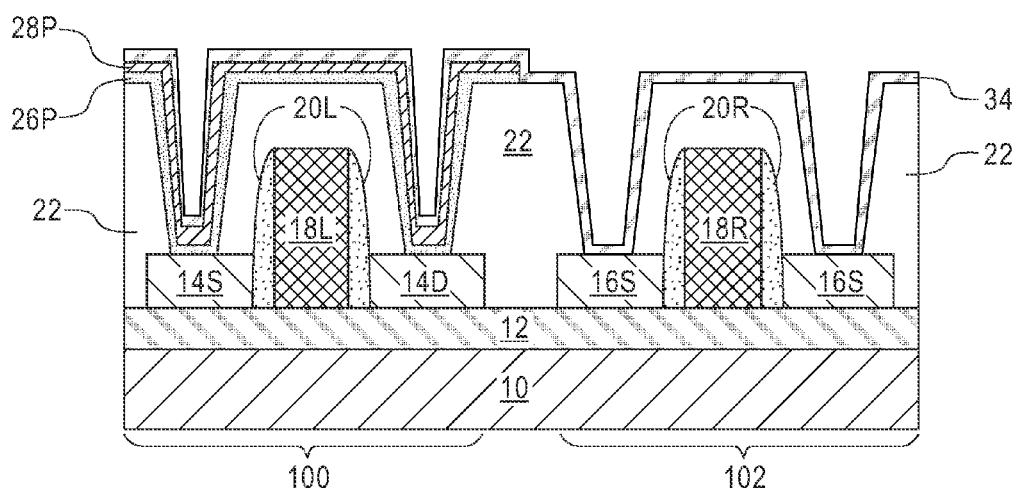
FIG. 16 is a cross sectional view of the exemplary semiconductor structure of FIG. 6 after forming a Ni—Pt alloy layer in both the nFET device region and the pFET device region, wherein a portion of the Ni—Pt alloy layer is present in each of the contact openings in the nFET and pFET device regions in accordance with a second embodiment of the present application.

Referring now to FIG. 16, there is illustrated the exemplary semiconductor structure of FIG. 6 after forming a Ni—Pt alloy layer 34 in both the nFET device region 100 and the pFET device region 102, wherein a portion of the Ni—Pt alloy layer 34 is present in each of the contact openings (24L, 24R) in the nFET and pFET device regions (100, 102) in accordance with a second embodiment of the present application. The Ni—Pt alloy layer 34 is a contiguous layer that is present atop the exposed surfaces of the diffusion barrier layer portion 28P, the exposed topmost and sidewall surfaces of the MOL dielectric material 22, and atop the exposed portion of the source region 16S and the drain region 16D. The Ni—Pt alloy layer 34 that is used in this embodiment of the present application is the same as mentioned above in providing the Ni—Pt alloy layer 34 to the exemplary semiconductor structure shown in FIG. 9 of the present application. The Ni—Pt alloy layer 34 of this embodiment of the present application can be formed by one of the techniques mentioned above in forming the Ni—Pt alloy layer 34 to the exemplary semiconductor structure shown in FIG. 9. Also, the Ni—Pt alloy layer 34 of this embodiment can have a thickness within the range mentioned above for the Ni—Pt alloy layer 34 shown in FIG. 9.

Figure 17:
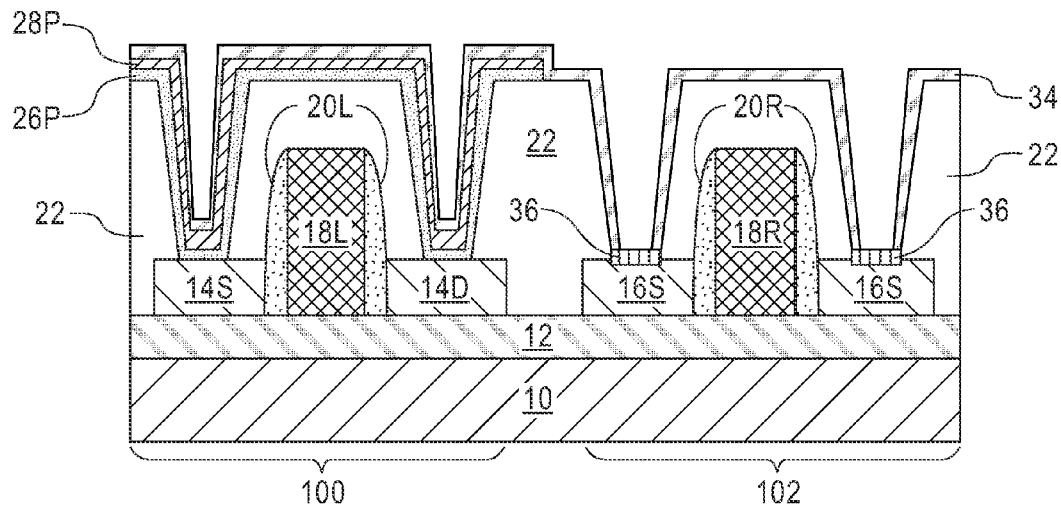
FIG. 17 is a cross sectional view of the exemplary semiconductor structure of FIG. 16 after performing an anneal to form a Ni—Pt semiconductor alloy in each contact opening in the pFET device region.

Referring now to FIG. 17, there is illustrated the exemplary semiconductor structure of FIG. 16 after performing an anneal to form a Ni—Pt semiconductor alloy 36 in each contact opening 24R in the pFET device region 102. As is shown and on one side of the pFET functional gate structure 18R, a bottommost surface of the Ni—Pt semiconductor alloy 36 directly contacts a surface of the source region 16S, while on the other side of the pFET functional gate structure 18R, a bottommost surface of the Ni—Pt semiconductor alloy 36 directly contacts a surface of the drain region 16D. During the anneal, a portion of the Ni—Pt alloy layer 34 directly above the source region 16S and the drain region 16D and a portion of the source region 16S and the drain region 16D are consumed. Thus, during annealing, a portion of the Ni—Pt alloy layer 34 and a semiconductor portion of the source region 16S or drain region 16D react and collectively form the Ni—Pt semiconductor alloy 36. The anneal used in this embodiment of the present application is the same as that described above in forming the exemplary semiconductor structure shown in FIG. 10. Due to the presence of the diffusion barrier layer portion 28P, no metal semiconductor alloy forms in the nFET device region 100 during this step of the present application.

Figure 18:
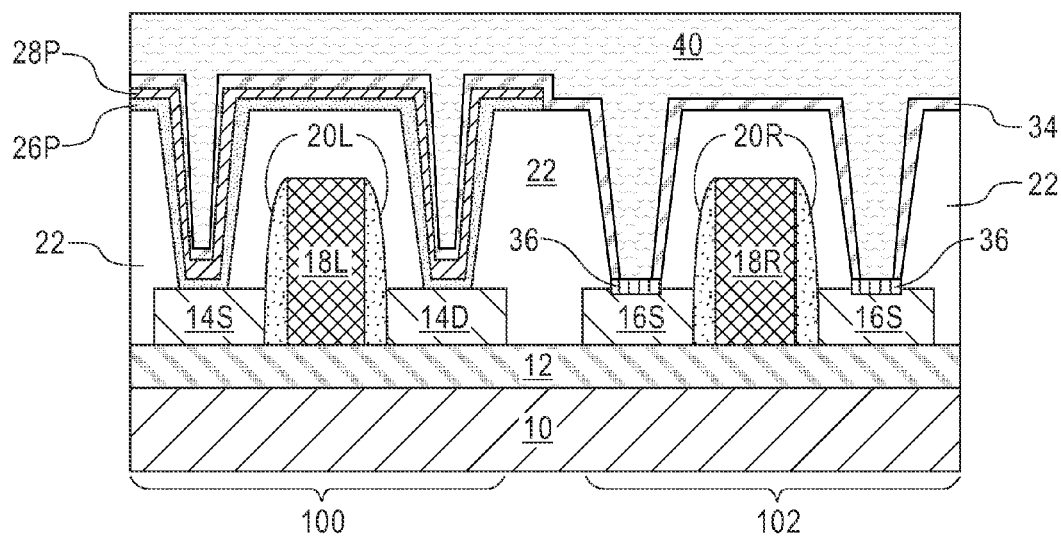
FIG. 18 is a cross sectional view of the exemplary semiconductor structure of FIG. 17 after formation of a conductive metal in both the nFET and pFET device regions.

Referring now to FIG. 18, there is illustrated of the exemplary semiconductor structure of FIG. 17 after formation of a conductive metal 40 in both the nFET and pFET device regions (100, 102). In this embodiment, the conductive metal 40 is formed directly on a remaining portion of the Ni—Pt alloy layer 34. The conductive metal 40 of this embodiment of the present application includes one of the conductive materials mentioned above for providing the conductive metal 40 to the exemplary semiconductor structure shown in FIG. 14. Also, conductive metal 40 of this embodiment of the present application can be formed utilizing one of the techniques mentioned above for providing conductive metal 40 to the exemplary semiconductor structure shown in FIG. 14.

Figure 19:
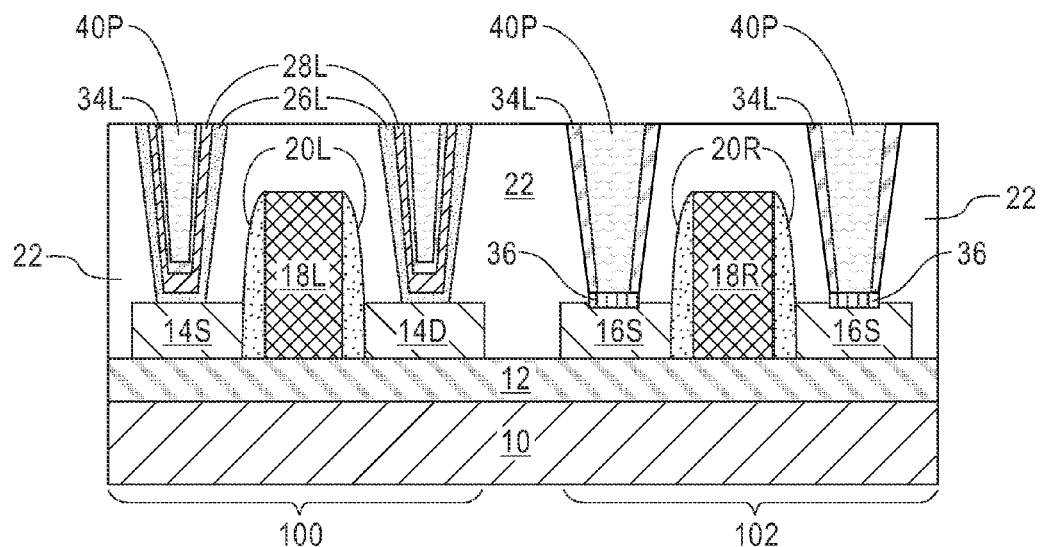
FIG. 19 is a cross sectional view of the exemplary semiconductor structure of FIG. 18 after performing a planarization process stopping at a topmost surface of the MOL dielectric material.

Referring now to FIG. 19, there is illustrated the exemplary semiconductor structure of FIG. 18 after performing a planarization process stopping at a topmost surface of the MOL dielectric material 22. The planarization process that can be used in the present application may include chemical mechanical polishing (CMP) and/or grinding. The planarization process removes portions of conductive metal 40, portions of the Ni—Pt alloy layer 34, portions of the diffusion barrier layer portion 28P, and portions of the titanium layer portion 26P that extend outside and above the mouth of each contact opening (24L, 24R).

Each remaining portion of the conductive metal 40 constitutes a metal contact portion 40P of the present application. Each remaining portion of the Ni—Pt alloy layer 34 constitutes a Ni—Pt alloy liner 34L. Each remaining portion of the diffusion barrier layer portion 28P constitutes a diffusion barrier liner 28L. Each remaining portion of the titanium layer portion 26P constitutes a titanium liner 26L of the present application.

As is shown in FIG. 19, a contact structure (i.e., nFET contact structure) is provided in the nFET device region 100 that includes, from bottom to top, titanium liner 26L, diffusion barrier liner 28L, Ni—Pt alloy liner 34L and metal contact portion 40P. In this embodiment, topmost surfaces of each of elements 26L, 28L, 34L and 40P that provide the nFET contact structure are coplanar with each other as well as being coplanar with a topmost surface of the MOL dielectric material 22. In the nFET device region 100, a portion of the bottommost surface of the titanium liner 26L directly contacts a topmost surface of the source region 14S or the drain region 14D. In the pFET device region 102, the contact structure (i.e., pFET contact structure) includes Ni—Pt semiconductor alloy 36, Ni—Pt alloy liner 34L, and metal contact portion 40P. In this embodiment, elements 34L and 40P that provide the pFET contact structure are coplanar with each other as well as being coplanar with a topmost surface of the MOL dielectric material 22. Also, and in this embodiment, element 36 is buried beneath elements 34L and 40P. In the pFET device region 102, the Ni—Pt semiconductor alloy 36 directly contacts a surface of the source region 16S or the drain region 16D. Also, the Ni—Pt alloy liner 34L within the contact opening 24R in the pFET device region 102 has a horizontal thickness that is less than a horizontal thickness of the Ni—Pt alloy liner 34L within the contact opening 24L in the nFET device region 100.

Figure 20:
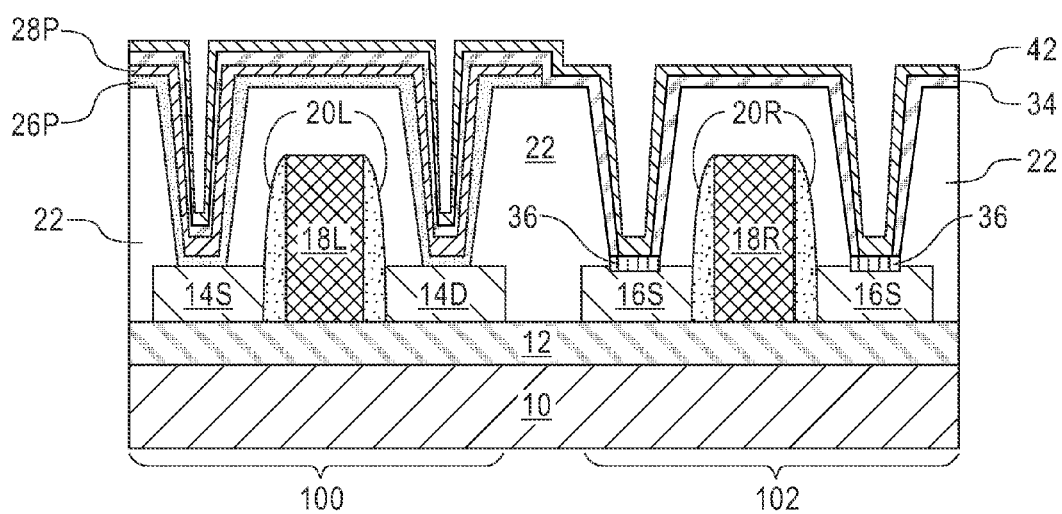
FIG. 20 is a cross sectional view of the exemplary semiconductor structure of FIG. 17 after forming another diffusion barrier layer in both the nFET and pFET device regions in accordance with a third embodiment of the present application.

Referring now to FIG. 20, there is illustrated the exemplary semiconductor structure of FIG. 17 after forming another diffusion barrier layer 42 in both the nFET and pFET device regions (100, 102) in accordance with a third embodiment of the present application. The another diffusion barrier layer 42 is a contiguous layer that covers an entirety of the Ni-PT alloy layer 34.

The another diffusion barrier layer 42 comprises a second diffusion barrier material that may include one of the diffusion barrier materials mentioned above for diffusion barrier layer 28. In one embodiment, the another diffusion barrier layer 42 and the diffusion barrier layer 28 comprise a same diffusion barrier material (e.g., TaN). In another embodiment, the another diffusion barrier layer 42 comprises a different diffusion barrier material than diffusion barrier layer 28. The another diffusion barrier layer 42 can be formed utilizing one of the deposition process mentioned above in forming the diffusion barrier layer 28. Also, the another diffusion barrier layer 42 may have a thickness within the range mentioned above for diffusion barrier layer 28.

Figure 21:
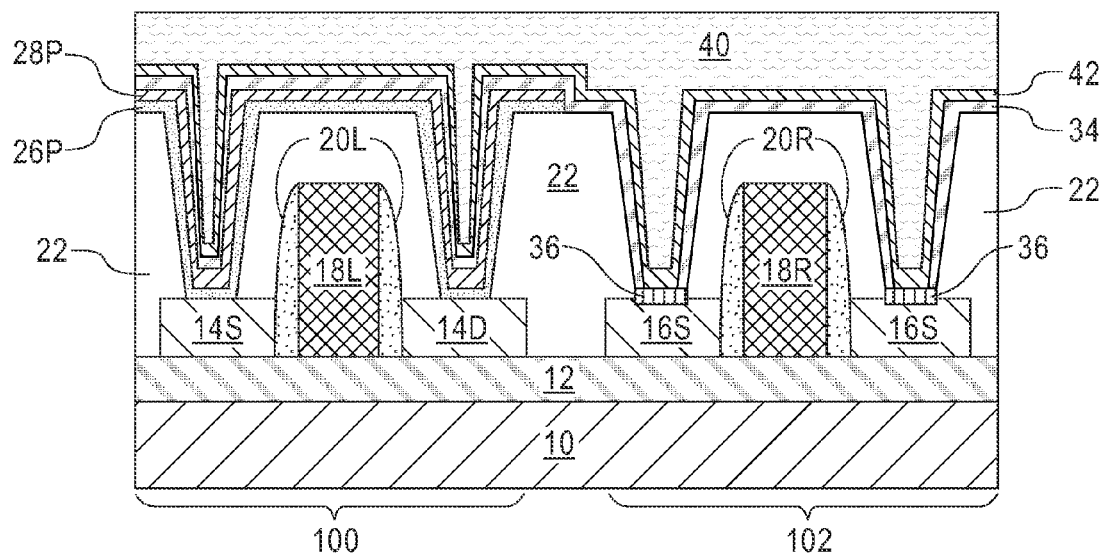
FIG. 21 is a cross sectional view of the exemplary semiconductor structure of FIG. 20 after formation of a conductive metal in both the nFET and pFET device regions.

Referring now to FIG. 21, there is illustrated the exemplary semiconductor structure of FIG. 20 after formation of a conductive metal 40 in both the nFET and pFET device regions (100, 102). In this embodiment, the conductive metal 40 is formed directly on the another diffusion barrier layer 42. The conductive metal 40 of this embodiment of the present application includes one of the conductive materials mentioned above for providing the conductive metal 40 to the exemplary semiconductor structure shown in FIG. 14. Also, conductive metal 40 of this embodiment of the present application can be formed utilizing one of the techniques mentioned above for providing conductive metal 40 to the exemplary semiconductor structure shown in FIG. 14.

Figure 22:
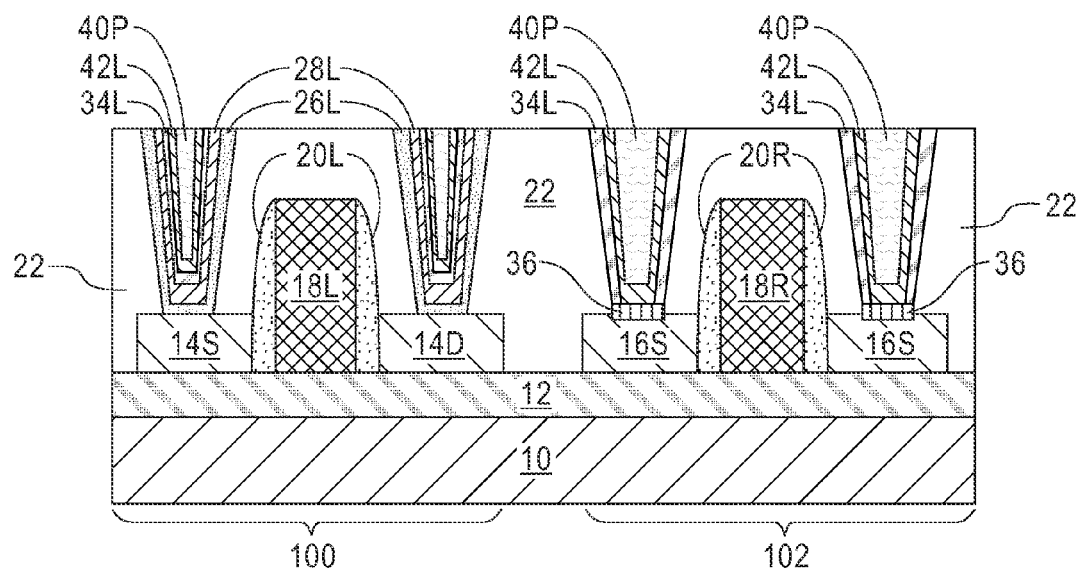
FIG. 22 is a cross sectional view of the exemplary semiconductor structure of FIG. 21 after performing a planarization process stopping at a topmost surface of the MOL dielectric material.

Referring now to FIG. 22, there is illustrated the exemplary semiconductor structure of FIG. 21 after performing a planarization process stopping at a topmost surface of the MOL dielectric material 22. The planarization process that can be used in the present application may include chemical mechanical polishing (CMP) and/or grinding. The planarization process removes portions of conductive metal 40, portions of the another diffusion barrier layer 42, portions of Ni—Pt alloy layer 34, portions of the diffusion barrier layer portion 28P, and portions of the titanium layer portion 26P that extend outside and above the mouth of each contact opening (24L, 24R).

Each remaining portion of the conductive metal 40 constitutes a metal contact portion 40P of the present application. Each remaining portion of the another diffusion barrier constitutes another diffusion barrier liner 42L. Each remaining portion of the Ni—Pt alloy layer 34 constitutes a Ni—Pt alloy liner 34L. Each remaining portion of the diffusion barrier layer portion 28P constitutes a diffusion barrier liner 28L; element 28L may be referred to as a first diffusion barrier liner, while element 42L may be referred to as a second diffusion barrier liner. Each remaining portion of the titanium layer portion 26P constitutes a titanium liner 26L of the present application.

As is shown in FIG. 22, a contact structure (i.e., nFET contact structure) is provided in the nFET device region 100 that includes, from bottom to top, titanium liner 26L, diffusion barrier liner 28L, Ni—Pt alloy liner 34L, another diffusion barrier liner 42L and metal contact portion 40P. In this embodiment, topmost surfaces of elements 26L, 28L, 34L, 42L and 40P that provide the nFET contact structure are coplanar with each other as well as being coplanar with a topmost surface of the MOL dielectric material 22. In the nFET device region 100, a portion of the bottommost surface of the titanium liner 26L directly contacts a topmost surface of the source region 14S or the drain region 14D. In the pFET device region 102, the contact structure (i.e., pFET contact structure) includes Ni—Pt semiconductor alloy 36, Ni—Pt alloy liner 34L, another diffusion barrier liner 42L and metal contact portion 40P. In this embodiment, the topmost surfaces of elements 34L, 42L and 40P that provide the pFET contact structure are coplanar with each other as well as being coplanar with a topmost surface of the MOL dielectric material 22. Also, and in this embodiment, element 36 is buried beneath elements 34L, 42L and 40P. In the pFET device region 102, the Ni—Pt semiconductor alloy 36 directly contacts a surface of the source region 16S or the drain region 16D. Also, the Ni—Pt alloy liner 34L within the contact opening 24R in the pFET device region 102 has a horizontal thickness that is less than a horizontal thickness of the Ni—Pt alloy liner 34L within the contact opening 24L in the nFET device region 100.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a substrate including a first semiconductor material portion located in an nFET device region and a second semiconductor material portion located in a pFET device region;
   an nFET functional gate structure located on a surface of said first semiconductor material portion, wherein a source region is located on one side of said nFET functional gate structure and a drain region is located on another side of said nFET functional gate structure;
   a pFET functional gate structure located on a surface of said second semiconductor material portion, wherein a source region is located on one side of said pFET functional gate structure and a drain region is located on another side of said pFET functional gate structure;
   nFET contact structures contacting an exposed portion of said source region and said drain region of said nFET functional gate structure, wherein each of said nFET contact structures includes a Ti liner in direct physical contact with an exposed portion of a surface of one of said source region or said drain region of said nFET functional gate structure; and
   pFET contact structures contacting an exposed portion of said source region and said drain region of said pFET functional gate structure, wherein each of said pFET contact structures includes a Ni—Pt semiconductor alloy in direct physical contact with an exposed portion of a surface of one of said source region or said drain region of said pFET functional gate structure.

2. The semiconductor structure of claim 1, wherein each of said nFET contact structures further comprises a diffusion barrier liner comprising a first diffusion barrier material and located on an exposed surface of said Ti liner, another diffusion barrier liner comprising a second diffusion barrier material and located on an exposed surface of said diffusion barrier liner, and a metal contact portion located on an exposed surface of said another diffusion barrier liner.

3. The semiconductor structure of claim 2, wherein each of said pFET contact structures further comprises a diffusion barrier liner comprising said second diffusion barrier material and in contact with an exposed topmost surface of said Ni—Pt semiconductor alloy, and a metal contact portion located on an exposed surface of said diffusion barrier liner comprising said second diffusion barrier material.

4. The semiconductor structure of claim 1, wherein each of said nFET contact structures further comprises a diffusion barrier liner located on an exposed surface of said Ti liner, a Ni—Pt alloy liner located on an exposed surface of said diffusion barrier liner, and a metal contact portion located on an exposed surface of said Ni-PT alloy liner.

5. The semiconductor structure of claim 4, wherein each of said pFET contact structures further comprises a Ni—Pt alloy liner located on an exposed topmost surface of said Ni—Pt semiconductor alloy, and a metal contact portion in contact with an exposed surface of said Ni—Pt alloy liner.

6. The semiconductor structure of claim 1, wherein each of said nFET contact structures further comprises a diffusion barrier liner comprising a first diffusion barrier material and located on an exposed surface of said Ti liner, a Ni—Pt alloy liner located on an exposed surface of said diffusion barrier liner, another diffusion barrier liner comprising a second diffusion barrier material and located on an exposed surface of said Ni—Pt alloy liner, and a metal contact portion located on an exposed surface of said another diffusion barrier liner.

7. The semiconductor structure of claim 6, wherein each of said pFET contact structures further comprises a Ni—Pt alloy liner located on an exposed topmost surface of said Ni—Pt semiconductor alloy, a diffusion barrier liner comprising said second diffusion barrier material and in contact with an exposed surface of said Ni—Pt alloy liner, and a metal contact portion in contact with an exposed surface of said diffusion barrier liner.

8. The semiconductor structure of claim 1, wherein said first semiconductor material portion is a first semiconductor fin in which said nFET functional gate structure straddles over a portion of said first semiconductor fin, and wherein said second semiconductor material portion is a second semiconductor fin in which said pFET functional gate structure straddles over a portion of said second semiconductor fin.

9. The semiconductor structure of claim 1, wherein said Ni—Pt semiconductor alloy is Ni—Pt silicide.

10. The semiconductor structure of claim 1, further comprising a middle-of-the-line (MOL) dielectric material surrounding said nFET functional gate structure and said pFET functional gate structure, and wherein said nFET contact structures and said pFET contact structures are present in said MOL dielectric material.

11. A method of forming a semiconductor structure, said method comprising:
   forming a structure comprising an nFET functional gate structure located on a surface of a first semiconductor material portion of a substrate, wherein a source region is formed on one side of said nFET functional gate structure and a drain region is formed on another side of said nFET functional gate structure, and a pFET functional gate structure located on a surface of a second semiconductor material portion of said substrate, wherein a source region is formed on one side of said pFET functional gate structure and a drain region is formed on another side of said pFET functional gate structure;
   forming a middle-of-the-line (MOL) dielectric material surrounding said nFET functional gate structure and said pFET functional gate structure, wherein said MOL dielectric material comprises contact openings that expose a portion of each of said source regions and said drain regions of both said nFET functional gate structure and said pFET functional gate structure; and
   forming nFET contact structures within a first set of said contact openings and contacting said exposed portion of said source region and said drain region of said nFET functional gate structure, and pFET contact structures within a second set of said contact openings and contacting said exposed portion of said source region and said drain region of said pFET functional gate structure, wherein each of said nFET contact structures includes a Ti liner in direct physical contact with said exposed portion of one of said source region or said drain region of said nFET functional gate structure, and wherein each of said pFET contact structures includes a Ni—Pt semiconductor alloy in direct physical contact with said exposed portion of one of said source region or said drain region of said pFET functional gate structure.

12. The method of claim 11, wherein said forming said nFET contact structures and said pFET contact structures comprises:
   forming a titanium layer in said first and said second sets of said contact openings;
   forming a diffusion barrier layer on said titanium layer;
   forming a block mask over and within said first set of said contact openings;
   removing said diffusion barrier layer and said titanium layer from said second set of said contact openings;
   removing said block mask from over and within said first set of said contact openings;
   forming a sacrificial material plug within said first set of said contact openings, but not said second set of said contact openings;
   forming a Ni—Pt alloy layer over said first set of said contact openings and within said second set of said contact openings;
   annealing to form said Ni—Pt semiconductor alloy in said second set of said contact openings; and
   removing said sacrificial material plug within said first set of said contact openings.

13. The method of claim 12, further comprising:
   forming another diffusion barrier layer within said first and said second sets of said openings;
   forming a conductive metal within and above said first and said second sets of said contact openings; and
   planarizing to a topmost surface of said MOL dielectric material.

14. The method of claim 11, wherein said forming said nFET contact structures and said pFET contact structures comprises:
   forming a titanium layer in said first and said second sets of said contact openings;
   forming a diffusion barrier layer on said titanium layer;
   forming a block mask over and within said first set of said contact openings;
   removing said diffusion barrier layer and said titanium layer from said second set of said contact openings;
   removing said block mask from over and within said first set of said contact openings;
   forming a Ni—Pt alloy layer over said first set of said contact openings and within said second set of said contact openings; and
   annealing to form said Ni—Pt semiconductor alloy in said second set of said contact openings.

15. The method of claim 14, further comprising:
   forming a conductive metal within and above said first and said second sets of said contact openings; and
   planarizing to a topmost surface of said MOL dielectric material.

16. The method of claim 15, wherein prior to forming said conductive metal, another diffusion barrier layer is formed within said first and second sets of said contact openings.

17. The method of claim 11, wherein said first semiconductor material portion and said second semiconductor material portion are spaced apart semiconductor fins, wherein said semiconductor fins are formed by patterning a topmost semiconductor material layer of a semiconductor-on-insulator substrate or an upper portion of a bulk semiconductor substrate.

18. The method of claim 11, wherein said Ni—Pt semiconductor alloy is formed by forming a Ni—Pt alloy layer at least within said second set of said contact openings and annealing.

19. The method of claim 18, wherein a portion of said Ni—Pt alloy layer remains in said second set of said contact openings.

20. The method of claim 18, wherein another portion of said Ni—Pt alloy layer remains in said first set of said contact openings.

* * * * *